United States Patent
Yoon et al.

(10) Patent No.: US 7,408,217 B2
(45) Date of Patent: Aug. 5, 2008

(54) METAL-INSULATOR TRANSITION SWITCHING TRANSISTOR AND METHOD FOR MANUFACTURING THE SAME

(75) Inventors: Doo Hyeb Yoon, Daejon (KR); Hyun Tak Kim, Daejon (KR); Byung Gyu Chae, Daejon (KR); Kwang Yong Kang, Daejon (KR); Sung Lyul Maeng, Chungcheongbuk-Do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 10/576,579

(22) PCT Filed: Apr. 1, 2004

(86) PCT No.: PCT/KR2004/000760

§ 371 (c)(1),
(2), (4) Date: Apr. 20, 2006

(87) PCT Pub. No.: WO2005/041308

PCT Pub. Date: May 6, 2005

(65) Prior Publication Data

US 2007/0069193 A1 Mar. 29, 2007

(51) Int. Cl.
*H01L 29/772* (2006.01)
(52) U.S. Cl. ........................... 257/310; 257/192
(58) Field of Classification Search ................. 257/310, 257/192
See application file for complete search history.

(56) References Cited

U.S. PATENT DOCUMENTS

| 6,121,642 | A | 9/2000 | Newns |
| 6,653,704 | B1 * | 11/2003 | Gurney et al. ............... 257/421 |
| 2004/0069991 | A1 * | 4/2004 | Dunn et al. .................. 257/75 |

FOREIGN PATENT DOCUMENTS

| KR | 20030024156 | 3/2003 |
| WO | WO9534504 | 12/1995 |

OTHER PUBLICATIONS

'Observation of the Mott Transition in VO₂ Based Transistors', Kim, Hyun-Tak, et al. Telecom. Basic Research Lab, ETRI, Daejeon 305-350, South Korea (Aug. 2, 2003) pp. 1-4.
'Gate-Induced Mott Transition'. Kim, Hyun-Tak, et al. Telecom. Basic Research Lab, ETRI, Daejeon 305-350, Korea (May 27, 2003) pp. 1-4.

(Continued)

*Primary Examiner*—Long Pham
(74) *Attorney, Agent, or Firm*—Ladas & Parry LLP

(57) ABSTRACT

Provided is a metal-insulator-transition switching transistor with a gate electrode on a silicon substrate (back-gate structure) and a metal-insulator-transition channel layer of $VO_2$ that changes from an insulator phase to a metal phase, or vice versa, depending on a variation of an electric field, and a method for manufacturing the same, whereby it is possible to fabricate a metal-insulator-transition switching transistor having high current gain characteristics and being stable thermally.

4 Claims, 4 Drawing Sheets

OTHER PUBLICATIONS

Kim, Hyun-Tak et al, "Gate Induced Mott Transition", May 27, 2003, *New Journal of Physics*.

Malinenko, V.P, "Metal-Semiconductor Phase Transition in Structurally Disordered Vanadium Dioxide". May 3, 1983, *American Institute of Physics*.

Zhang, J.G et al, "The Switching Mechanism in V205 Gel Films", Mar. 14, 1988, *Journal of Applied Physics*.

Stefanovich, G. et al, "Electrical Switching and Mott Transition in VO2", Jul. 24, 2000, *Journal of Physics*.

Boriskov, P.P et al, "The Effect of Electric Field on Metal-Insulator Phase Transition in Vanadium Dioxide", Dec. 28, 2001, *American Institute of Physics*.

* cited by examiner

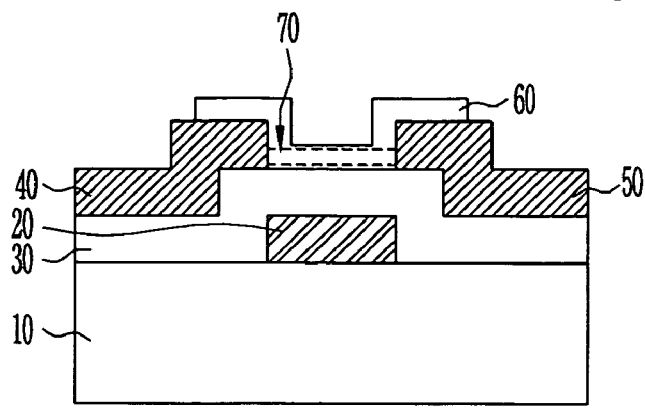
[Fig. 1]
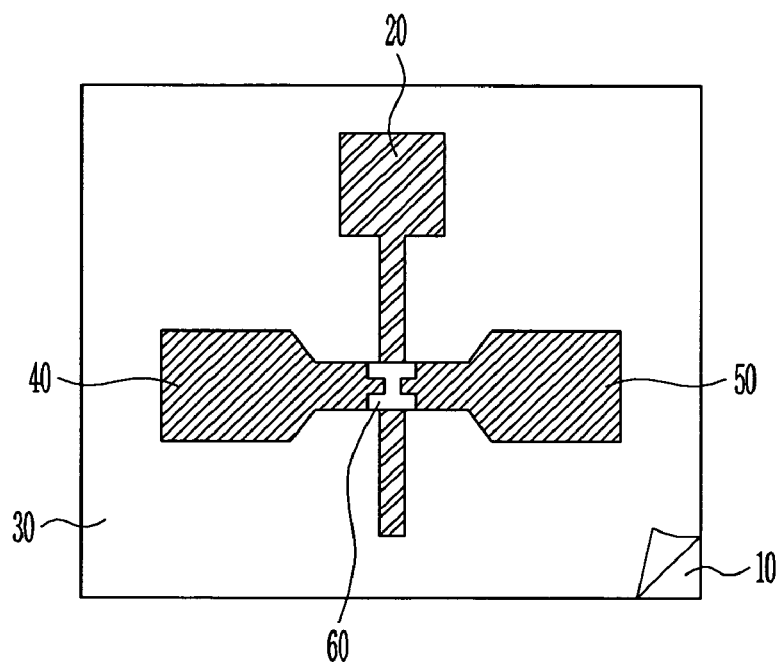
[Fig. 2]
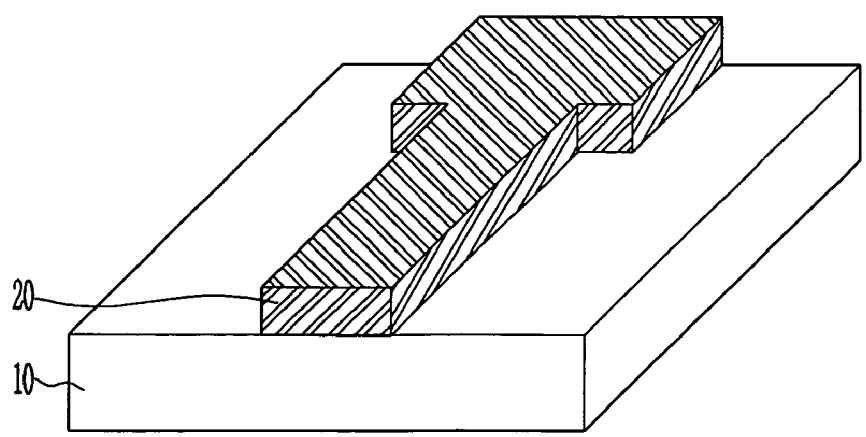
[Fig. 3]

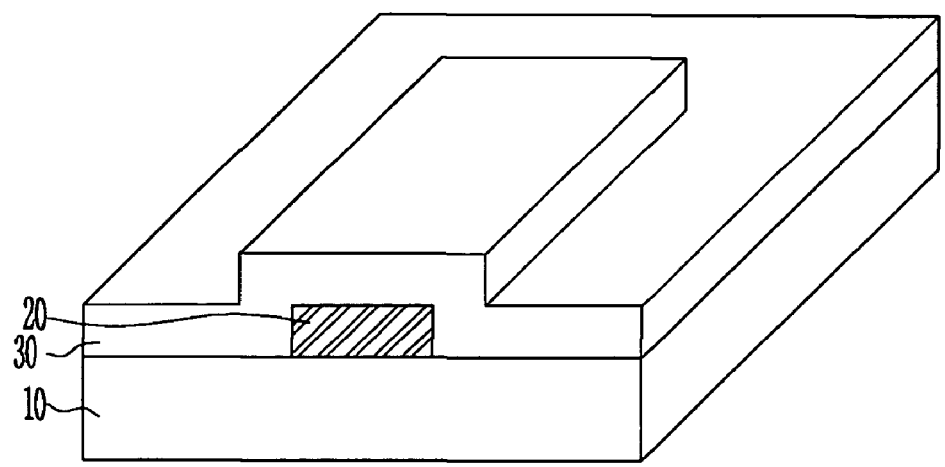
[Fig. 4]
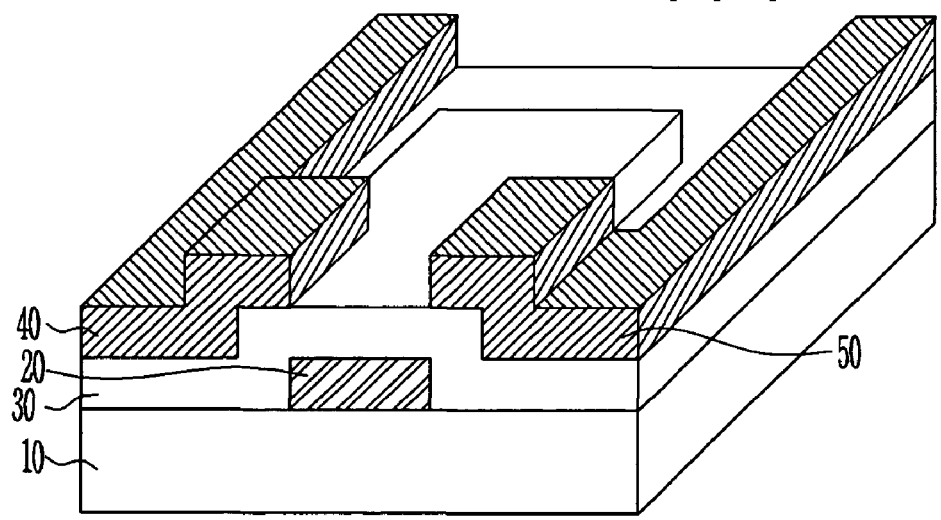
[Fig. 5]
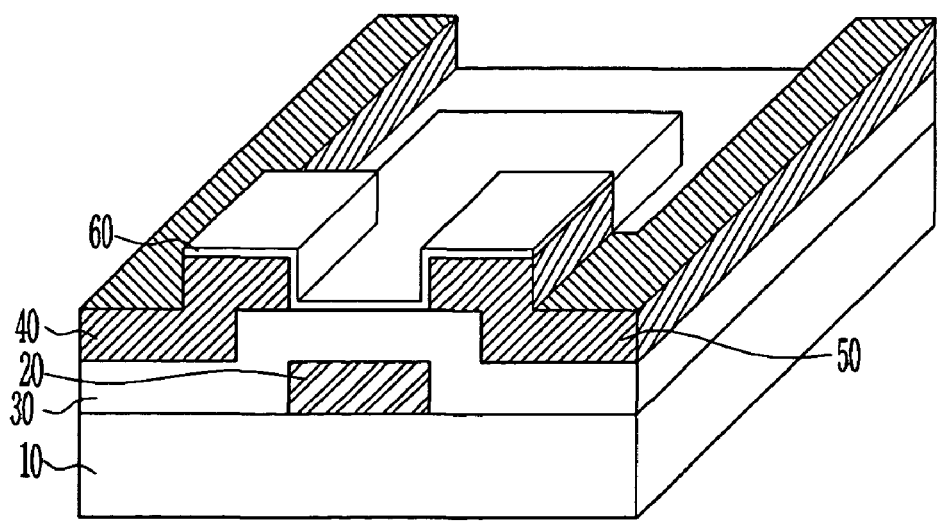
[Fig. 6]

[Fig. 7]
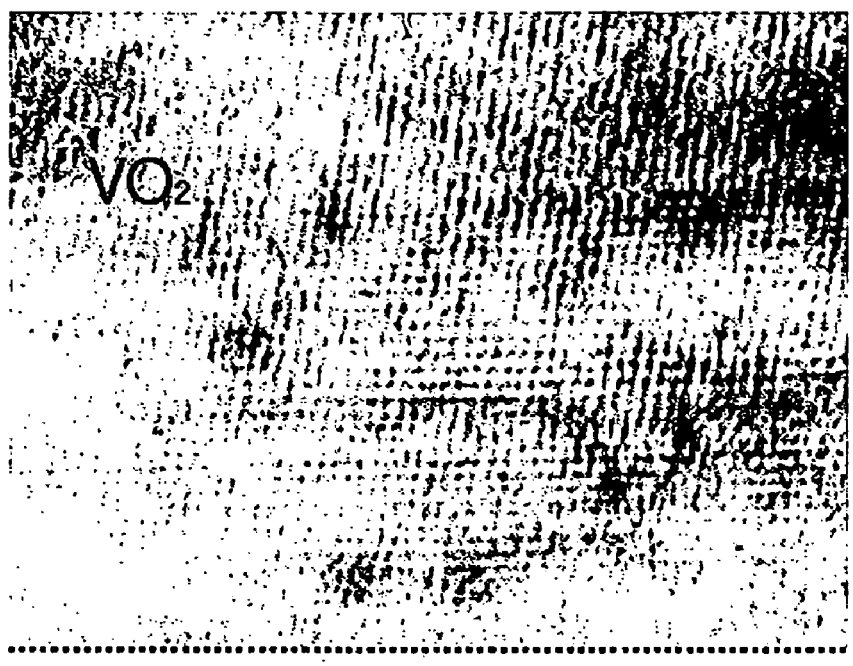
Interface between SiO2 and VO2
[Fig. 8]
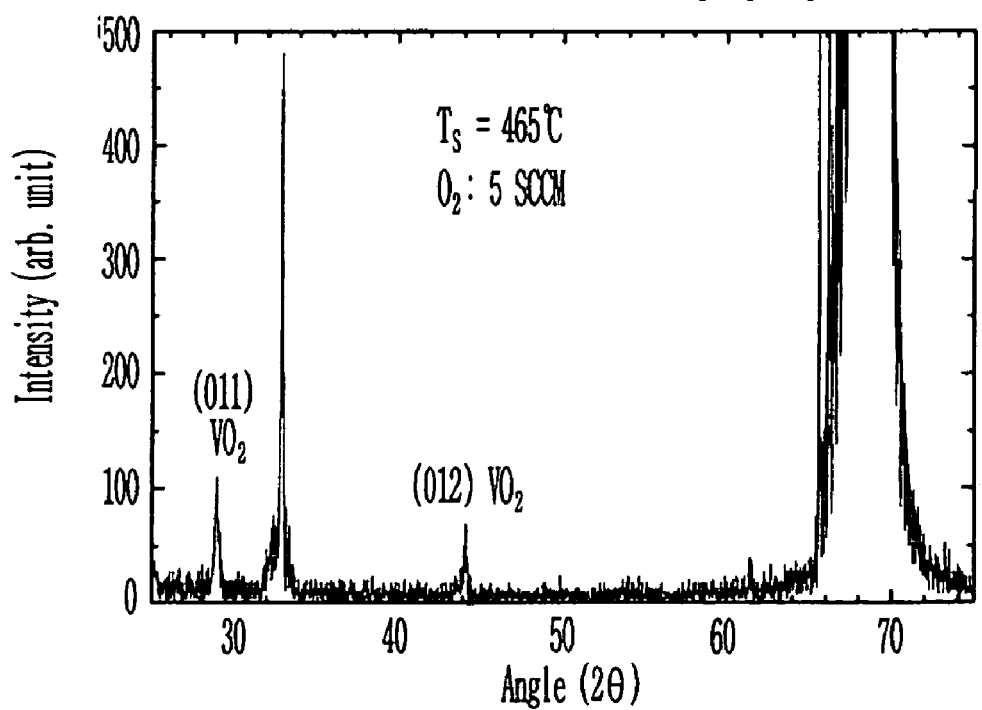

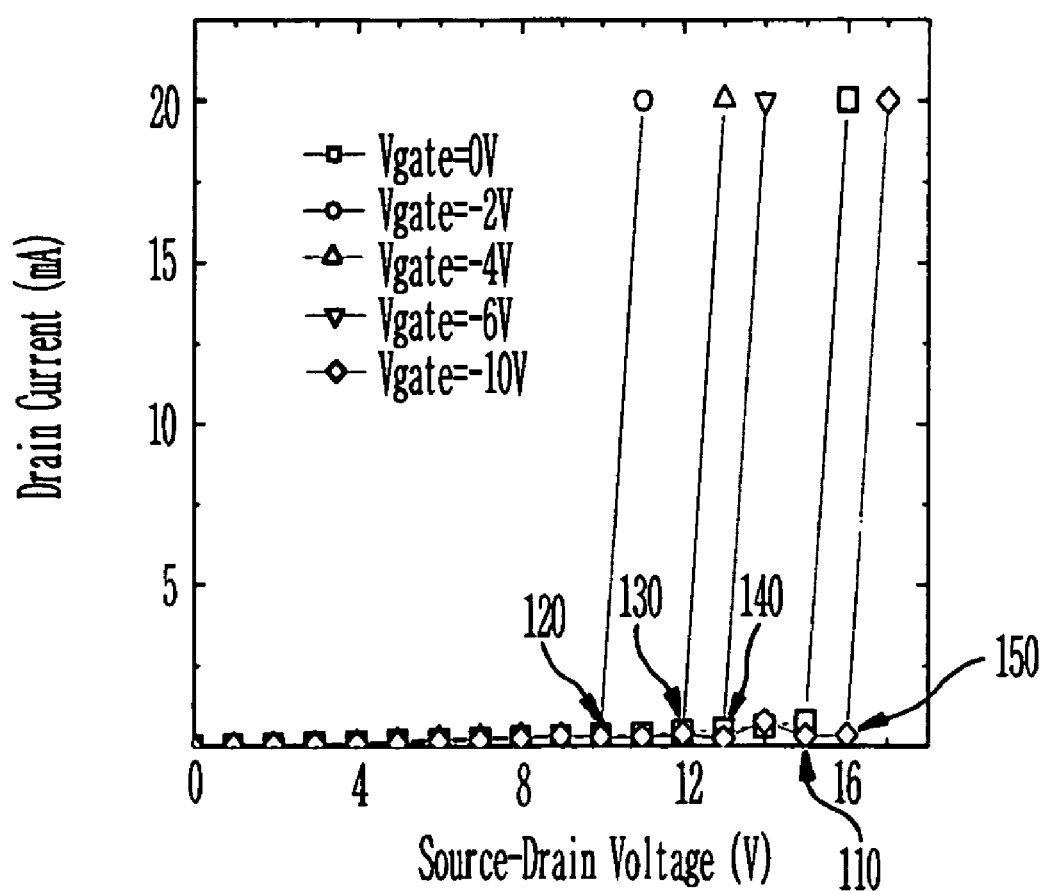

US 7,408,217 B2

METAL-INSULATOR TRANSITION SWITCHING TRANSISTOR AND METHOD FOR MANUFACTURING THE SAME

BACKGROUND

1. Field of the Invention

The present invention relates to a metal-insulator transition switching transistor (three terminal device) and a method for manufacturing the same and, more particularly, to a metal-insulator-transition switching transistor using a vanadium dioxide ($VO_2$) thin film as a metal-insulator-transition channel layer, and a method for manufacturing the same.

2. Discussion of Related Art

As a conventional transistor that has been developed for the purpose of an ultra small size and an ultra high speed, there are metal-oxide-semiconductor field-effect transistor (MOSFET) and Mott transistor developed by IBM, representatively. The Mott transistor has been disclosed in "D. M. Newns, J. A. Misewich, C. C. Tsuei, A. Gupta, B. A. Scott, and A. Schrott, Appl. Phys. Lett. Vol. 73, 780 (1998)". However, there has been a problem that a current gain decreases due to an increase of a depletion area in the channel when a channel length in the channel layer is reduced, since the two kinds of transistors use a semiconducting regime as a current channel layer. Thus, for inducing a current amplification, a multi-gate structure in which a plurality of gates is used has been employed inevitably.

In addition, large channel length for forming a PN junction, a multi-gate structure, and etc., are required in the conventional transistors, since they make use of a semi-conductor characteristic in which the number of carriers in a semiconductor is limited. Thus, a current gain would be confined, in spite of modifications of structures.

As a transistor using a metal-insulator transition, an MGBRK (Mott-Gutzwiller-Brinkman-Rice-Kim transistor has been developed by ETRI. The MGBRK transistor has been disclosed in "Hyun-Tak Kim and Kwang-Yong Kang, U.S. Pat. No. 6,624,463 B2". This is composed of the top-down structure in which a channel layer of $LaTiO_3$ (or $V_2O_3$) is on an insulator substrate. In the structure, cooling (or emission) of heat induced by Joule heating in the metal state is not easy. Channel layer material, $LaTiO_3$ (or $V_2O_3$), has more leakage current than $VO_2$. These are defects for a high speed switching transistor.

SUMMARY OF THE INVENTION

The present invention is directed to a metal-insulator-transition switching transistor having a small size and high current gain characteristic, and a method for manufacturing the same. In addition, a transistor of the present invention is stable thermally.

One aspect of the present invention is to provide a metal-insulator-transition switching transistor, comprising: a silicon substrate; a gate electrode on the substrate (back-gate structure); a gate insulation film on the gate and the substrate; a metal-insulator-transition channel layer of $VO_2$ on the gate insulation film, wherein the metal-insulator-transition channel layer changes from an insulator phase to a metal phase, or vice versa, depending on a variation of an electric field; and a source and a drain being contacted with the both sides of the metal-insulator-transition channel layer, respectively.

Here, the substrate is a silicon substrate. The source and the drain electrodes are a double layer constituted by materials selected from the group consisting of either a chrome (Cr) layer and a gold (Au) layer or a tungsten (W) layer and a titanium (Ti) layer. In addition, the metal-insulator-transition channel layer is composed of a vanadium dioxide ($VO_2$) thin film.

Another aspect of the present invention is to provide a method for manufacturing a metal-insulator-transition switching transistor, comprising the steps of: forming a gate electrode on a substrate; forming a gate insulation film on the substrate and the gate; forming a source electrode and a drain electrode on the gate insulation film; and forming a metal-insulator-transition channel layer between the source and the drain.

Here, the source and the drain electrodes are a double layer constituted by materials selected from the group consisting of either a chrome (Cr) layer and a gold (Au) layer or a tungsten (W) layer and a titanium (Ti) layer. And, the step of forming the source and the drain are performed using a lift-off process.

In a preferred embodiment of the present invention, the metal-insulator-transition channel layer is formed by a vanadium dioxide ($VO_2$) thin film, and the $VO_2$ thin film is grown at a growth temperature in the range of 450 to 470° C. and with an oxygen flow variation in the range of 5 to 6 SCCM.

BRIEF DESCRIPTION OF THE DRAWINGS

The above and other objects, advantages and features of the present invention will become apparent from the following description of preferred embodiments given in conjunction with accompanying drawings, in which:

FIGS. 1 and 2 are a cross sectional view and a plane view of a metal-insulator-transition switching transistor according to a preferred embodiment of the present invention;

FIGS. 3 to 6 are perspective views sequentially showing processes for manufacturing a metal-insulator transition switching transistor, according to a preferred embodiment of the present invention;

FIG. 7 is a picture of a $VO_2$ thin film observed by a high-resolution transmission electron microscopy, wherein the $VO_2$ thin film is grown at a growth temperature of 465° C. and with an oxygen flow variation of 50 SCCM, and FIG. 8 is a result of X-ray diffraction peak analysis thereof; and FIG. 9 shows a variation of drain currents ($I_{ds}$) depending on a gate voltage ($V_{gate}$) applied to a gate and a source-drain voltage ($V_{ds}$) of a metal-insulator-transition switching transistor, according to a preferred embodiment of the present invention.

DETAILED DESCRIPTION OF PREFERRED EMBODIMENTS

The present invention will be described in detail by way of a preferred embodiment with reference to accompanying drawings, in which like reference numerals are used to identify the same or similar parts.

FIGS. 1 and 2 are a cross sectional view and a plane view of a metal-insulator-transition (MIT) switching transistor according to a preferred embodiment of the present invention.

Referring to FIGS. 1 and 2, a metal-insulator-transition transistor comprises a substrate 10, a gate electrode 20, a gate insulation film 30, a source electrode 40, a drain electrode 50, and a metal-insulator-transition channel layer 60.

Preferably, the substrate 10 is a silicon substrate having an excellent thermal conductivity. In case where a vanadium dioxide ($VO_2$) thin film having a thermally unstable characteristic is used for the metal-insulator-transition channel layer 60, it is possible to prevent that a transistor characteristic becomes deteriorated due to a heat, which is generated in the metal phase inside the transistor at the time of a high voltage being applied for operating the transistor, by using the silicon substrate having an excellent thermal conductivity instead of a conventional sapphire substrate having a bad thermal conductivity. The gate electrode 20, the gate insulation film 30, the source electrode 40, the drain electrode 50, and the metal-insulator-transition channel layer 60 are fabricated on the substrate 10 This is the back-gate structure with $VO_2$ on Si substrate and is different from the transistor with both a channel material of $LaTiO_3$ (or $V_2O_3$) and the top-down structure with a channel layer on the substrate explained in U.S. Pat. No. 6,624,463 B2.

The gate electrode 20 may be formed using a tungsten-silicide (W/Si) with a thickness of 100 nm.

As for the gate insulation film 30, a silicon oxide film having a thickness of 200 nm may be employed. The gate insulation film 30 is placed between the gate 20 and the metal-insulator-transition channel layer 60.

As for the source electrode 40 and the drain electrode 50, a double layer composed of a chrome (Cr) layer and a gold (Au) layer may be used, and the double layer may have a thickness of 50 nm. The chrome (Cr) is used for improving an adhesion between the gate insulation film 30 and the Au thin film, and the thickness thereof is about 50 nm. In addition, a Ti/W layer as an electrode can be used instead of an Au/Cr film.

The metal-insulator-transition channel layer 60 changes from an insulator phase to a metal phase, or vice versa, depending on a variation of an electric field. The metal-insulator-transition channel layer 60 is placed between the source 40 and the drain 50, and contacted with them. The metal-insulator-transition channel layer 60 may be formed, for example, using a $VO_2$ with a thickness and a width in the range of 90 to 100 nm and 3 to 10 μm, respectively. When a constant voltage is applied to the gate 20 by inducing of holes inside the metal-insulator-transition channel layer 60, the metal-insulator transition occurs. As a result, a conductive channel 70 with electron carriers, through which a large quantity of currents flows, is formed. The theory for induction of the hole has been disclosed in "NATO Science Series" Kluwer, 2002, Vol II/67 p. 137, by Hyun-Tak Kim, http://www-.lanl.gov/abs/condmat/0110112, and "Metal-Insulator Transition", Chapter 3, Taylor & Frances, 2nd edition, 1990, by N. F. Mott.

Hereinafter, a principle for operation of the metal-insulator-transition switching transistor, according to a preferred embodiment of the present invention, will be explained.

When a constant voltage is applied to the source electrode 40 and the drain electrode 50, an electronic potential having a predetermined value is generated. In addition, the holes (i.e. the charging carriers having a low concentration), which are induced by the gate insulator 30, are added into the metal-insulator transition channel layer 60 when a gate voltage ($V_{gate}$) is applied to the gate electrode 20 In the metal-insulator transition channel layer 60 having the added holes, the conductive channel 70 with electron carriers is formed due to occurrence of the abrupt metal-insulator transition phenomenon. Through the conductive channel 70 as mentioned above, a large quantity of currents canes to flow between the source 40 and the drain 50

Next, a method for manufacturing the metal-insulator-transition switching transistor according to a preferred embodiment of the present invention will be explained with reference from FIGS. 3 to 6.

As shown in FIG. 3, a pattern of the gate 20 is formed in the substrate 10 Preferably, the substrate 10 is a silicon substrate having an excellent thermal conductivity, and the gate 20 may be formed using a tungsten-silicide (W/Si) with a thickness of 100 nm. In addition, the gate 20 can be formed doping a gate-electrode material into a silicon substrate.

In FIG. 4, the gate insulation film 30 is formed using a silicon oxide film ($SiO_2$) with a thickness of 200 nm.

As shown in FIG. 5, the source electrode 40 and the drain electrode 50 are formed. As for a method for forming the source 40 and the drain 50 such a method may be employed that an Au/Cr film with a thickness of 200 nm is deposited by evaporation equipment, and then, a pattern is formed using a lift-off process. The chrome (Cr) is used for improving an adhesion between the gate insulation film 30 and the Au thin film, and the thickness thereof is about 50 nm. In addition, a Ti/W as an electrode can be used instead of an Au/Cr film.

In FIG. 6, the metal-insulator-transition channel layer 60 is formed. The metal-insulator-transition channel layer 60 may be formed using a $VO_2$ with a thickness and a width in the range of 90 to 100 nm and 3 to 10 μm, respectively.

Hereinafter, the characteristic of the method for manufacturing the metal-insulator-transition switching transistor, according to a preferred embodiment of the present invention, will be explained.

In case where the metal-insulator-transition switching transistor is manufactured by a method similar to that of a MOSFET of a prior art, at first, a metal-insulator-transition channel layer is formed, a gate insulation film is deposited by a high temperature deposition process such as a plasma-enhanced-chemical-vapor-deposition (PECVD) method, and then, a source, a drain, and a gate are formed. When the metal-insulator-transition switching transistor is fabricated, as described above, a characteristic in the metal-insulator-transition channel layer, which has already been formed in a lower portion and is sensitive to a heat, may be changed by following processes performed at a high temperature.

For preventing such problems, a method for fabricating a transistor of a back-gate structure may be employed in the metal-insulator-transition switching transistor of the present invention. Here, the back-gate structure means that the gate electrode, the gate insulation film, the source electrode, and the drain electrode are formed at first, and then a metal-insulator-transition channel layer is formed, as mentioned above. Therefore, the resultant metal-insulator-transition switching transistor would be thermally more stable and have higher credibility than the transistor in U.S. Pat. No. 6,624,463 B2.

Referring to FIGS. 7 and 8, growth conditions of the $VO_2$ thin film, at the time of forming the metal-insulator-transition channel layer by employing the $VO_2$ thin film, will be explained.

FIG. 7 is a picture of a $VO_2$ thin film observed by a high-resolution transmission electron microscopy, wherein the $VO_2$ thin film is grown at a growth temperature of 465° C. and with oxygen flow of 50 SCCM, and FIG. 8 is a result of X-ray diffraction peak analysis thereof. In FIG. 7, the $VO_2$ thin film having an excellent characteristic with a large size of grain and a flat surface could be obtained under such growth conditions. In FIG. 8, it can be ensured that a poly-crystalline $VO_2$ thin film could be obtained under such growth conditions. In other words, it is known that the poly-crystalline $VO_2$ thin film would be formed under such growth conditions since peaks of the $VO_2$ of (011) and (012) planes appear. In addition, it should be noted that the $VO_2$ thin film, which is grown at a growth temperature in the range of 450 to 470° C. and with an oxygen flow variation in the range of 5 to 6 SCCM, has an excellent characteristic similar to the aforementioned results, by an experiment.

In case where a growth temperature is 450° C. or less, there have been problems that a grain size decreases, a surface is not flat, and the $VO_2$ thin film becomes amorphous. By contrast, in case where a growth temperature is 470° C. or more, an oxygen depletion phase such as a $V_2O_3$ may be formed. Meanwhile, a $V_2O_3$ of an oxygen depletion phase may be formed, in case where an oxygen flow is 5 SCCM or less. In addition, a $V_2O_3$ or $V_2O_3$ having rich oxygen may be formed, as known by a phenomenon that fine and long grains increase, in case where oxygen flow is 6 SCCM or more.

Hereinafter, a current characteristic of the metal-insulator-transition switching transistor, according to a preferred embodiment of the present invention, will be explained with referent to FIG. 9.

FIG. 9 shows a drain current ($I_{ds}$) shift depending on a gate voltage ($V_{gate}$) applied to the gate electrode and a source-drain voltage ($V_{ds}$) of the metal-insulator-transition switching transistor.

A drain current ($I_{ds}$) shift is measured at room temperature, while varying a voltage ($V_{ds}$) between the source and the drain in the range of $V_{ds}$=0 to 20 V, and a gate voltage ($V_{gate}$) applied to the gate in the range of $V_{gate}$=0 to –10V with –2V intervals.

In the case of varying a voltage ($V_{ds}$) between the source and the drain in the range of 0 to 20 V while not applying a voltage to the gate (that is, $V_{gate}$=0), a current jump phenomenon that drain currents $I_{ds}$ dramatically increase at a voltage ($V_{ds}$) between the source and the drain of 15V (110) is observed, for the first time. An abrupt change of drain currents ($I_{ds}$), as described above, results from an abrupt increase of a current due to the metal-insulator transition.

In the case of varying a gate voltage ($V_{gate}$) applied to the gate from $V_{gate}$=0 to –10V with –2V intervals while applying a voltage ($V_{ds}$) between the source and the drain, it is observed that a source-drain voltage (Metal-Insulator-Transition $V_{ds}$) at a point where drain current ($I_{ds}$) increase abruptly moves from 110 to 150 sequentially in FIG. 9, that is, 110 ⇒120⇒130⇒140⇒150 (where 110 to 150 correspond to reference numerals of FIG. 9), as shown in FIG. 9. Such result means that it is possible to control a high current gain characteristic while alternatively varying a voltage ($V_{gate}$) applied to the gate from $V_{gate}$=0 to –10V with –2V intervals. In other words, in case where a source-drain voltage ($V_{ds}$) is set to 12V, drain currents ($I_{ds}$) approach zero ($I_{ds}$=0) when a voltage ($V_{gate}$) applied to the gate is set to 0V. Therefore, a transistor becomes an off state. When a gate voltage ($V_{gate}$) applied to the gate is set to –2V, drain currents ($I_{ds}$) have a larger value, and thus a transistor becomes an on state. Meanwhile, the maximum drain current is limited to 20 mA so as to protect the transistor when it is measured.

According to the present invention, there is a merit that a switching transistor having a high current gain could be realized without a limitation of a size, by employing a metal-insulator-transition channel layer instead of a semiconductive channel layer of a conventional PN junction type.

In addition, the present invention employs a silicon substrate and the back-gate structure having an excellent thermal conductivity instead of a conventional sapphire substrate, whereby it is possible to prevent that a characteristic of a metal-insulator-transition channel layer is changed due to a heat, which is generated in the interior.

Further, it is possible to prevent that a characteristic of a $VO_2$ thin film is changed by the latter part of the processes, since the metal-insulator-transition switching transistor of the present invention is manufactured in a manner of a back-gate structure.

According to the present invention, a metal-insulator-transition switching transistor having a large channel length could be fabricated with a low cost by using a silicon substrate and the back-gate structure, and a conventional silicon-based technology can be adapted easily.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A metal-insulator transition switching transistor, comprising:
   a silicon substrate;
   a gate electrode formed directly on the substrate;
   a gate insulation film on the gate electrode and the silicon substrate;
   an abrupt metal-insulator-transition channel layer on the gate insulation film, wherein the abrupt metal-insulator-transition channel layer changes from an insulator phase to a metal phase abruptly, or vice versa, depending on a variation of an electric field; and
   a source and a drain being contacted with both sides of the abrupt metal-insulator-transition channel layer, respectively.

2. The metal-insulator-transition switching transistor as claimed in claim 1, wherein the substrate is made of silicon.

3. The metal-insulator-transition switching transistor as claimed in claim 1, wherein the source and the drain is a double layer constituted by materials selected from the group consisting of either a chrome (Cr) layer and a gold (Au) layer or a tungsten (W) layer and a titanium (Ti) layer.

4. The metal-insulator-transition switching transistor as claimed in claim 1, wherein the abrupt metal-insulator-transition channel layer is composed of a vanadium dioxide ($VO_2$) thin film.

* * * * *